US010838558B2

(12) United States Patent
Lee et al.

(10) Patent No.: US 10,838,558 B2
(45) Date of Patent: Nov. 17, 2020

(54) FLEXIBLE DISPLAY DEVICE AND METHOD OF MANUFACTURING THE SAME

(71) Applicant: SAMSUNG DISPLAY CO., LTD., Yongin-si (KR)

(72) Inventors: Ungsoo Lee, Yongin-si (KR); Jinwoo Park, Yongin-si (KR); Hoyoun Kim, Yongin-si (KR); Hyunchul Oh, Yongin-si (KR); Jaewan Yoo, Yongin-si (KR); Hyunsoo Jung, Yongin-si (KR); Suhyuk Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 443 days.

(21) Appl. No.: 14/940,117

(22) Filed: Nov. 12, 2015

(65) Prior Publication Data

US 2016/0306460 A1    Oct. 20, 2016

(30) Foreign Application Priority Data

Apr. 15, 2015 (KR) .......................... 10-2015-0053141

(51) Int. Cl.
*G06F 3/044* (2006.01)
*G06F 3/041* (2006.01)
(Continued)

(52) U.S. Cl.
CPC ............ *G06F 3/044* (2013.01); *G06F 3/0412* (2013.01); *H01L 21/56* (2013.01); *H01L 27/322* (2013.01);
(Continued)

(58) Field of Classification Search
CPC .......... G06F 3/047; G06F 3/041; G06F 3/044; G06F 3/0412; G06F 2203/04113;
(Continued)

(56) References Cited

U.S. PATENT DOCUMENTS 9,152,265 B2    10/2015  Liu
2008/0309226 A1*  12/2008  Kim ................... H01L 51/5256
                                                                    313/504
(Continued)

FOREIGN PATENT DOCUMENTS

EP     2704197 A1    3/2014
EP     2991116 A1    3/2016
(Continued)

OTHER PUBLICATIONS

EPO Extended Search Report dated Sep. 15, 2016, for corresponding European Patent Application No. 16159473.4 (9 pages).

*Primary Examiner* — Md Saiful A Siddiqui
(74) *Attorney, Agent, or Firm* — Lewis Roca Rothgerber Christie LLP

(57) ABSTRACT

A flexible display device includes a first flexible substrate, a display unit on the first flexible substrate, a thin film encapsulation layer for encapsulating the display unit, a cover layer for covering the thin film encapsulation layer, a touch screen layer on the cover layer, and a second flexible substrate on the touch screen layer, wherein the touch screen layer includes a sensing pattern unit, and a touch pad unit electrically connected to the sensing pattern unit, wherein the cover layer is under the sensing pattern unit, and wherein a thickness of the cover layer from an upper surface of the thin film encapsulation layer to a lower surface of the touch screen layer is about 1 μm to about 20 μm.

10 Claims, 10 Drawing Sheets

(51) Int. Cl.
*H01L 51/52* (2006.01)
*H01L 21/56* (2006.01)
*H01L 27/32* (2006.01)
*H01L 51/00* (2006.01)

(52) U.S. Cl.
CPC ........ *H01L 27/323* (2013.01); *H01L 51/0096* (2013.01); *H01L 51/5253* (2013.01); *H01L 51/5281* (2013.01); *G06F 2203/04102* (2013.01); *G06F 2203/04103* (2013.01); *G06F 2203/04113* (2013.01); *H01L 2227/323* (2013.01); *H01L 2251/5338* (2013.01); *H01L 2251/558* (2013.01); *H01L 2251/566* (2013.01)

(58) Field of Classification Search
CPC ............ G06F 2203/04102; G06F 2203/04103; H05K 7/02; G09G 3/32; G02F 1/1335
See application file for complete search history.

(56) References Cited

U.S. PATENT DOCUMENTS

| | | | |
|---|---|---|---|
| 2009/0047859 A1 | 2/2009 | Kim et al. | |
| 2012/0001534 A1 | 1/2012 | Kim | |
| 2012/0181923 A1 | 7/2012 | Cho et al. | |
| 2014/0028596 A1* | 1/2014 | Seo | G06F 3/0487 345/173 |
| 2014/0062909 A1* | 3/2014 | Choi | G09G 3/32 345/173 |
| 2014/0078705 A1* | 3/2014 | Jo | H05K 7/02 361/767 |
| 2014/0132488 A1* | 5/2014 | Kim | H01L 51/52 345/76 |
| 2014/0183473 A1* | 7/2014 | Lee | H01L 51/0097 257/40 |
| 2015/0060817 A1 | 3/2015 | Sato et al. | |
| 2015/0370391 A1* | 12/2015 | Chen | G06F 3/0412 345/173 |
| 2016/0062520 A1* | 3/2016 | Choi | H01L 27/3248 345/174 |
| 2016/0116801 A1* | 4/2016 | Fan | G02F 1/133617 349/71 |

FOREIGN PATENT DOCUMENTS

| | | |
|---|---|---|
| KR | 10-2009-0017014 A | 2/2009 |
| KR | 10-2012-0003664 A | 1/2012 |
| KR | 10-2012-0082736 A | 7/2012 |
| KR | 10-2013-0115819 A | 10/2013 |
| KR | 10-2013-0117112 A | 10/2013 |
| TW | 201308137 A1 | 2/2013 |
| TW | 201426929 A | 7/2014 |

* cited by examiner

FLEXIBLE DISPLAY DEVICE AND METHOD OF MANUFACTURING THE SAME

CROSS-REFERENCE TO RELATED PATENT APPLICATION

This application claims priority to and the benefit of Korean Patent Application No. 10-2015-0053141, filed on Apr. 15, 2015, in the Korean Intellectual Property Office, the disclosure of which is incorporated herein in its entirety by reference.

BACKGROUND

1. Field

One or more exemplary embodiments relate to a flexible display device and a method of manufacturing the same.

2. Description of the Related Art

Currently, research and development are conducted on providing various types of display devices that are installed in electronic devices, together with an effort to provide electronic devices of various forms. Research is also being conducted on applying a touch panel function to display devices. When a touch panel function is applied to a display device, a finger, a pen, or the like of a user contacts the surface of the display device, and thus the display device can function as an input device.

Organic light-emitting diode (OLED) displays do not require an additional light source, and thus can be driven with a low voltage, and can be manufactured to be lightweight and thin. Also, OLED displays have favorable characteristics, such as a wide viewing angle, high contrast, and fast response speed, and thus have drawn attention as a next-generation display.

SUMMARY

One or more exemplary embodiments relate to a flexible display device, and a method of manufacturing the flexible display device.

Additional aspects will be set forth in part in the description that follows and, in part, will be apparent from the description, or may be learned by practice of the presented embodiments.

According to one or more exemplary embodiments, a flexible display device includes a first flexible substrate, a display unit on the first flexible substrate, a thin film encapsulation layer for encapsulating the display unit, a cover layer for covering the thin film encapsulation layer, a touch screen layer on the cover layer, and a second flexible substrate on the touch screen layer, wherein the touch screen layer includes a sensing pattern unit, and a touch pad unit electrically connected to the sensing pattern unit, wherein the cover layer is under the sensing pattern unit, and wherein a thickness of the cover layer from an upper surface of the thin film encapsulation layer to a lower surface of the touch screen layer is about 1 μm to about 20 μm.

The thickness of the cover layer may be about 5 μm to about 20 μm.

The cover layer may include silicon-based resin.

The flexible display device may further include a connection unit under the touch pad unit and at a lateral side of the cover layer.

The flexible display device may further include a pad unit on the first flexible substrate and configured to transmit an electrical signal to the display unit, and the touch pad unit and the pad unit may be aligned with each other at an exterior of the thin film encapsulation layer.

The second flexible substrate may be cut to expose the pad unit on the first flexible substrate.

The connection unit may include an insulative resin layer with conductive balls distributed therein.

The flexible display device may further include a polarization layer between the touch screen layer and the second flexible substrate.

The display unit may include a plurality of sub-pixels, and the polarization layer may define a plurality of apertures at locations corresponding to respective ones of the sub-pixels.

The flexible display device may further include color filters corresponding to colors of light emitted by the plurality of sub-pixels within respective ones of the apertures.

According to one or more exemplary embodiments, a method of manufacturing a flexible display device includes forming a first flexible substrate on a surface of a first mother substrate, forming a plurality of display units on the first flexible substrate, forming a plurality of thin film encapsulation layers for respectively encapsulating the plurality of display units on the first flexible substrate, forming a second flexible substrate on a surface of a second mother substrate, forming a plurality of touch screen layers on the second flexible substrate, coating each of the plurality of touch screen layers with a filler, arranging the first mother substrate and the second mother substrate such that the plurality of display units face the plurality of touch screen layers, hardening the filler to form cover layers, adhering the first mother substrate to the second mother substrate, forming a plurality of display units by cutting the adhered first and second mother substrates along cutting lines, and removing cut portions of the first and second mother substrates from the plurality of display units, wherein each of the touch screen layers includes a sensing pattern unit and a touch pad unit electrically connected to the sensing pattern unit, wherein the cover layers are positioned under the sensing pattern units, and wherein a thickness of each of the cover layers from an upper surface of one of the plurality of thin film encapsulation layers to a lower surface of one of the plurality of touch screen layers is about 1 μm to about 20 μm.

The thickness of each of the cover layers may be about 5 μm to about 20 μm.

The cover layers may include silicon-based resin.

The coating the plurality of touch screen layers may include forming an insulative resin layer with conductive balls distributed therein on the touch pad unit, and the hardening the filler may include hardening the insulative resin layer to form connection units.

The forming the plurality of display units may include forming, on the first flexible substrate, pad units electrically connected to respective ones of the display units, and cutting the second flexible substrates of the plurality of display units to expose the pad units on the first flexible substrate.

In each of the plurality of display units, the touch pad unit and the pad unit may be aligned.

The method may further include forming a plurality of polarization layers on the second flexible substrate, wherein each of the plurality of polarization layers defines a plurality of apertures, and forming a red filter, a green filter, or a blue filter in each of the plurality of apertures.

The plurality of display units may include a plurality of sub-pixels that overlap the plurality of apertures, and the red, green, or blue filters may correspond to the color emitted by a respective one of the sub-pixels.

The method may further include, before the forming the first flexible substrate and the second flexible substrate, respectively forming graphene oxide layers on the first mother substrate and the second mother substrate.

The removing the cut first and second mother substrates may include physically removing the cut first and second mother substrates, together with the graphene oxide layers, from the plurality of display units.

BRIEF DESCRIPTION OF THE DRAWINGS

These and/or other aspects will become apparent and more readily appreciated from the following description of the embodiments, taken in conjunction with the accompanying drawings, in which.

DETAILED DESCRIPTION

Figure 1:
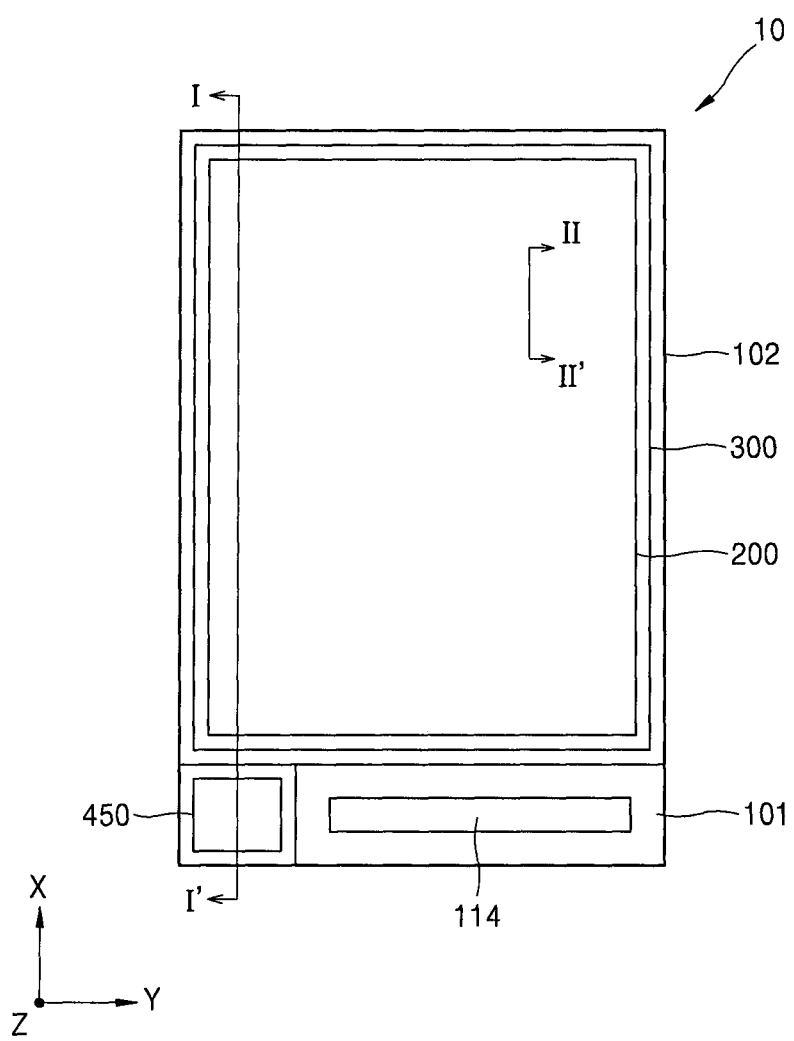
FIG. 1 is a schematic plan view of a flexible display device according to an embodiment of the present invention.

Features of the inventive concept and methods of accomplishing the same may be understood more readily by reference to the following detailed description of embodiments and the accompanying drawings. The inventive concept may, however, be embodied in many different forms and should not be construed as being limited to the embodiments set forth herein. Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present invention. As used herein, the singular forms "a," "an," and "the" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
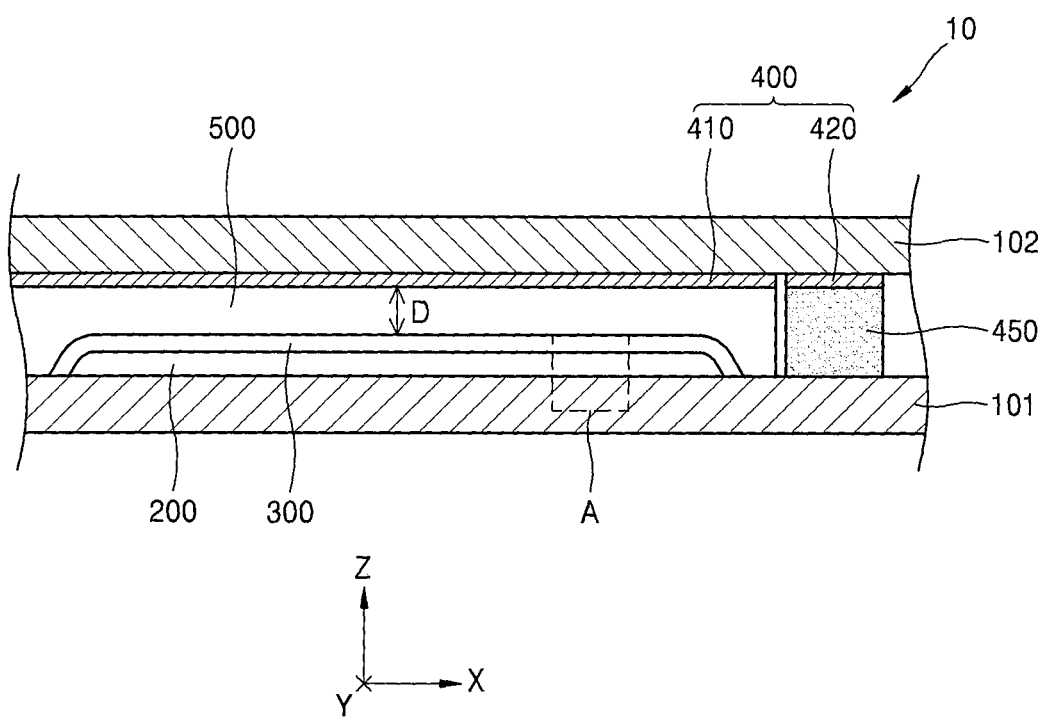
FIG. 2 is a cross-sectional view taken along the line I-I' of FIG. 1.
Figure 3:
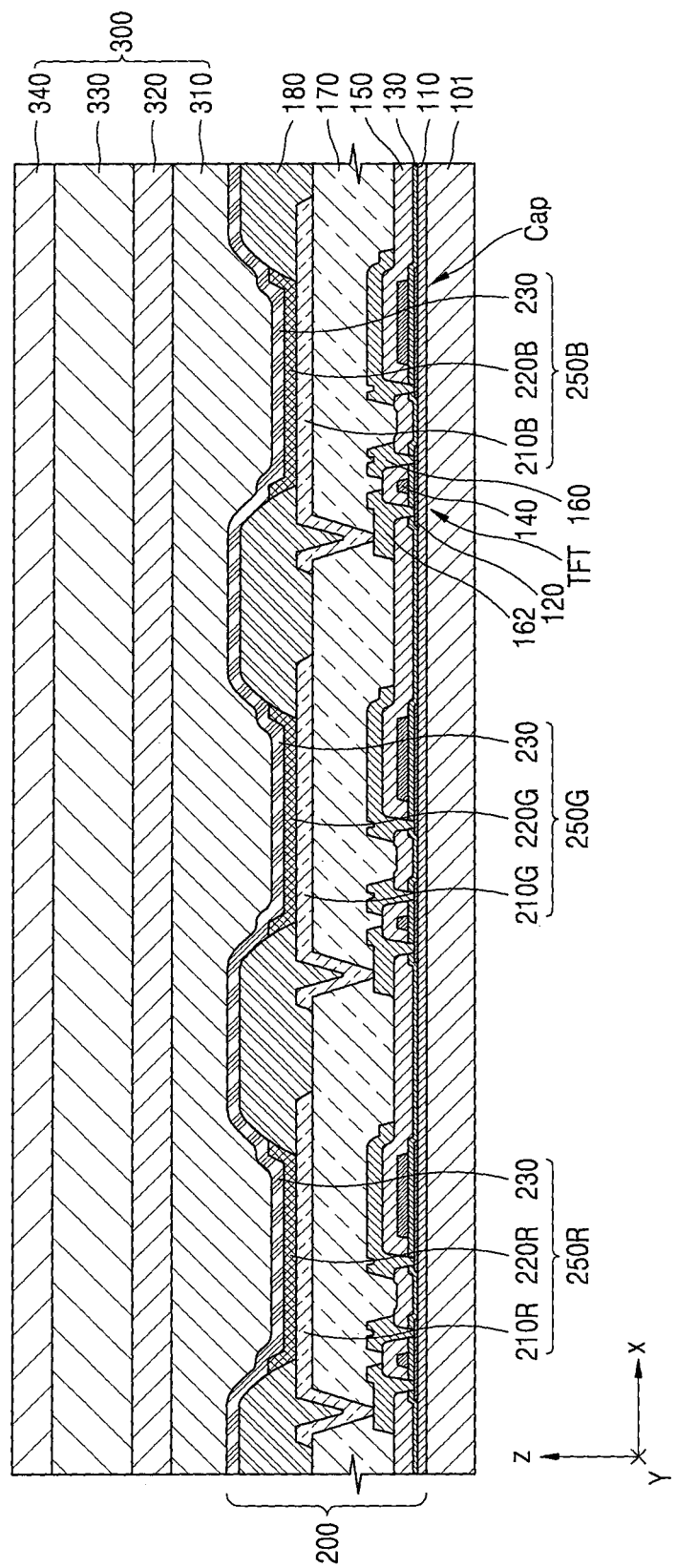
FIG. 3 is a magnified cross-sectional view of the portion A of FIG. 2.

FIG. 1 is a schematic plan view of a flexible display device 10 according to an embodiment of the present invention, FIG. 2 is a schematic cross-sectional view taken along the line I-I' of FIG. 1, and FIG. 3 is a magnified cross-sectional view of the portion A of FIG. 2.

Referring to FIGS. 1-3, the flexible display device 10 may include a first flexible substrate 101, a display unit 200 on the first flexible substrate 101, a thin film encapsulation layer 300 encapsulating the display unit 200, a cover layer 500 on the thin film encapsulation layer 300, a touch screen layer 400 on the cover layer 500, and a second flexible substrate 102 on the touch screen layer 400.

The first flexible substrate 101 is flexible, and thus may be formed of polyimide, acrylate, or the like. However, embodiments of the present invention are not limited thereto, and the first flexible substrate 101 may be formed of various other materials, such as a plastic material, such as polyethylene terephthalate (PET), polyethylene naphthalate (PEN), and/or a metal material. In some cases, the first flexible substrate 101 may be formed of a thin metal foil such as stainless steel/steel use stainless (SUS).

The display unit 200, which includes a display region and a pad unit 114 outside of the display region, may be formed on the first flexible substrate 101. The display unit 200 is configured to provide an image that may be recognized by a user. FIG. 3 illustrates an embodiment where the display unit 200 includes an organic light-emitting diode (OLED). However, other embodiments of the present invention are not limited thereto, and the display unit 200 may include a liquid crystal device, or any other type of display device. The pad unit 114 may transmit an electrical signal to the display unit 200 from a power supply device, or from a signal generation device. The display unit 200 will now be described in more detail with reference to FIG. 3.

A buffer layer 110 may be formed on the first flexible substrate 101. The buffer layer 110 may planarize an upper surface of the first flexible substrate 101, and may block foreign materials or moisture from entering via the first flexible substrate 101. For example, the buffer layer 110 may be formed of an inorganic material (such as silicon oxide, silicon nitride, silicon oxynitride, aluminum oxide, aluminum nitride, titanium oxide, and/or titanium nitride), an organic material (such as polyimide, polyester, and/or acryl), or stacks of these materials.

The display unit 200 may include a thin film transistor TFT, a capacitor Cap, and an OLED that is electrically connected to the thin film transistor TFT.

The thin film transistor TFT may include an active layer 120, a gate electrode 140, a source electrode 160, and a drain electrode 162.

The active layer 120 may include amorphous silicon, polycrystalline silicon, an oxide semiconductor, and/or an organic semiconductor. The gate electrode 140 is located on the semiconductor layer 120, and the source electrode 160 and the drain electrode 162 electrically communicate with each other in response to a signal applied to the gate electrode 140.

For example, the gate electrode 140 may be formed of at least one selected from aluminum (Al), platinum (Pt), palladium (Pd), silver (Ag), magnesium (Mg), gold (Au), nickel (Ni), neodymium (Nd), iridium (Ir), chrome (Cr), calcium (Ca), molybdenum (Mo), titanium (Ti), tungsten (W), and/or copper (Cu) in a single-layer structure or in a multi-layered structure, in consideration of adhesion to an adjacent layer, of surface smoothness of a layer stacked on the gate electrode 140, and of processability.

A gate insulation layer 130 formed of silicon oxide and/or silicon nitride, for example, may be interposed between the gate electrode 140 and the active layer 120.

An interlayer insulation layer 150 may be located on the gate electrode 140, and may be formed of a silicon oxide, a silicon nitride, or the like in a single-layered structure or a multi-layered structure.

The source electrode 160 and the drain electrode 162 are located on the interlayer insulation layer 150. The source electrode 160 and the drain electrode 162 may be electrically connected to the active layer 120 via respective contact holes in both of the interlayer insulation layer 150 and the gate insulation layer 130.

The source electrode 160 and the drain electrode 162 may each be formed of at least one selected from aluminum (Al), platinum (Pt), palladium (Pd), silver (Ag), magnesium (Mg), gold (Au), nickel (Ni), neodymium (Nd), iridium (Ir), chrome (Cr), calcium (Ca), molybdenum (Mo), titanium (Ti), tungsten (W), and/or copper (Cu) in a single-layered or multi-layered structure.

A first insulation layer 170 may be located on the source electrode 160 and the drain electrode 162. When an OLED is located on the thin film transistor TFT, the first insulation layer 170 mostly planarizes the upper surface of the thin film transistor TFT, and protects the thin film transistor TFT and various devices. The first insulation layer 170 may be formed of an acryl-based polymer such as polymethyl methacrylate (PMMA), polystyrene (PS), a polymer derivative having a phenol group, an imide-based polymer, an acryl ether-based polymer, an amide-based polymer, a fluorine-based polymer, a p-xylene-based polymer, a vinyl alcohol-based polymer, an inorganic material, and/or the like.

A second insulation layer 180 may be formed above the thin film transistor TFT, may be positioned on the first insulation layer 170, and may define an aperture(s). The second insulation layer 180 may be a pixel defining layer that defines a pixel region on the first flexible substrate 101.

The second insulation layer 180 may be, for example, an organic insulation layer. The organic insulation layer may include an acryl-based polymer such as polymethyl methacrylate (PMMA), polystyrene (PS), a polymer derivative having a phenol group, an imide-based polymer, an acryl ether-based polymer, an amide-based polymer, a fluorine-based polymer, a p-xylene-based polymer, a vinyl alcohol-based polymer, and/or a mixture of these materials.

OLEDs forming a red sub-pixel 250R, a green sub-pixel 250G, and a blue sub-pixel 250B may be located at respective pixel regions defined by the second insulation layer 180. The red sub pixel 250R may include a red emission pixel electrode 210R, a red emission intermediate layer 220R, and an opposite electrode 230. The green sub pixel 250G may include a green emission pixel electrode 210G, a green emission intermediate layer 220G, and the opposite electrode 230. The blue sub pixel 250B may include a blue emission pixel electrode 210B, a blue emission intermediate layer 220B, and the opposite electrode 230.

The pixel electrodes 210R, 210G, and 210B may be electrically connected to thin film transistors TFT, respectively, and may be implemented by using transparent electrodes or reflective electrodes. When the pixel electrodes 210R, 210G, and 210B are formed as transparent electrodes, the pixel electrodes 210R, 210G, and 210B may be formed of indium tin oxide (ITO), indium zinc oxide (IZO), zinc oxide (ZnO), indium oxide ($In_2O_3$), indium gallium oxide (IGO), and/or aluminum zinc oxide (AZO). When the pixel electrodes 210R, 210G, and 210B are formed as reflective electrodes, each of the pixel electrodes 210R, 210G, and 210B may include a reflective layer formed of silver (Ag), magnesium (Mg), aluminum (Al), platinum (Pt), palladium (Pd), gold (Au), nickel (Ni), neodymium (Nd), iridium (Ir), chromium (Cr), and/or a combination thereof, and a layer formed of ITO, IZO, ZnO, $In_2O_3$, IGO, and/or AZO. However, the embodiments of the present invention are not limited thereto, and the pixel electrodes 210R, 210G, and 210B may be formed of various other materials and may have various structures, such as a single-layered or multi-layered structure.

The red emission intermediate layer 220R, the green emission intermediate layer 220G, and the blue emission intermediate layer 220B respectively included in the red sub pixel 250R, the green sub pixel 250G, and the blue sub pixel 250B include emission layers (EML) for respectively emitting red light, green light, and blue light, and may each further include a hole injection layer (HIL), a hole transport layer (HTL), an electron transport layer (ETL), and/or an electron injection layer (EIL) in a single or complex structure. The intermediate layers 220R, 220G, 220B of other embodiments are not limited to the layers described above, and may have various other structures.

The opposite electrode 230 may be a common electrode (i.e., an electrode common to the red sub pixel 250R, the green sub pixel 250G, and the blue sub pixel 250B), and may be formed as a transparent electrode or as a reflective electrode.

When the opposite electrode 230 is formed as a transparent electrode, the opposite electrode 230 may have a layer formed of a metal having a small work function, that is, Li, Ca, LiF/Ca, LiF/Al, Al, Ag, Mg, and/or a combination thereof, and a transparent conductive layer formed of ITO, IZO, ZnO, and/or $In_2O_3$. When the opposite electrode 230 is formed as a reflective electrode, the opposite electrode 230 may have a layer formed of Li, Ca, LiF/Ca, LiF/Al, Al, Ag, Mg, and/or a combination thereof. The configuration of the opposite electrode 230, and the material used to form the opposite electrode 230, are not limited to those described above, and various modifications may be made to the opposite electrode 230 in other embodiments.

The thin film encapsulation layer 300 may encapsulate the display unit 200 to prevent external oxygen, moisture, and the like from permeating the display unit 200. The thin film encapsulation layer 300 may include a plurality of organic layers 310 and 330 and a plurality of inorganic layers 320 and 340. The plurality of organic layers 310 and 330 and the plurality of inorganic layers 320 and 340 may be alternately stacked. Although the thin film encapsulation layer 300 includes the two organic layers 310 and 330 and the two inorganic layers 320 and 340 in FIG. 3, embodiments of the present invention are not limited thereto. In other words, the thin film encapsulation layer 300 may further include a plurality of additional inorganic encapsulation layers and a plurality of additional organic encapsulation layers that alternately stack on one another, and the number of inorganic encapsulation layers stacked and the number of organic encapsulation layers stacked are not limited.

The organic layers 310 and 330 may be formed of at least one selected from acryl-based resin, methacryl-based resin, polyisoprene, vinyl-based resin, epoxy-based resin, urethane-based resin, cellulose-based resin, and perylene-based resin.

The inorganic layers 320 and 340 may be formed of at least one selected from silicon nitride, aluminum nitride, zirconium nitride, titanium nitride, hafnium nitride, tantalum nitride, silicon oxide, aluminum oxide, titanium oxide, tin oxide, cerium oxide, and/or silicon oxynitride (SiON).

The cover layer 500 may be located on the thin film encapsulation layer 300. The cover layer 500 may be formed of an elastic material. For example, a shore hardness of the cover layer 500 may be about 30 (Shore A). The cover layer 500 may cover the thin film encapsulation layer 300, and may prevent defects caused by an external physical force (e.g., cracks) from being generated in the inorganic layers 320 and 340 of the thin film encapsulation layer 300. When there is a foreign material on the thin film encapsulation layer 300 during manufacture, the cover layer 500 covers the foreign material, and planarizes an upper surface of the thin film encapsulation layer 300, thereby preventing degradation of barrier characteristics of the thin film encapsulation layer 300. In addition, the cover layer 500 may secure mechanical reliability of the flexible display device 10 by dispersing the stresses that are generated when the flexible display device 10 is bent.

The cover layer 500 may be formed of an elastic and adhesive material. The cover layer 500 may be formed of silicon-based photopolymer resin or silicon-based thermosetting resin. In more detail, the cover layer 500 may be formed of silicon-based resin including a siloxane cross-link reaction, for example, polymethyltrifluoropropyl siloxane or polymethylvinyl-siloxane, but embodiments of the present invention are not limited thereto.

The cover layer 500 may be formed to have a thickness D of about 1 µm to about 20 µm. The thickness D of the cover layer 500 denotes a shortest distance from an upper surface of the thin film encapsulation layer 300 to a lower surface of the touch screen layer 400. When the cover layer 500 has a thickness of less than about 1 µm, and when particles exist on the thin film encapsulation layer 300, it may be difficult to sufficiently cover the particles, and it may, therefore, also be difficult to prevent defects (such as cracks caused by an external physical force) from being generated in the inorganic layers 320 and 340 of the thin film encapsulation layer 300. On the other hand, when the cover layer 500 has a thickness of more than about 20 µm, flexibility of the flexible display device 10 may be degraded.

The cover layer 500 may improve touch sensitivity when the touch screen layer 400 is being touched. The touch screen layer 400 may be a capacitive layer including a sensing pattern unit 410, which may include a first electrode and a second electrode that cross each other, and the sensing pattern unit 410 and the opposite electrode 230 may form a capacitor. In this case, when a user touches the second flexible substrate 102, an external touch input unit (e.g., a finger or stylus) and the sensing pattern unit 410 form another capacitor. In other words, two capacitors may be serially connected to each other by a touch by the external touch input unit, and thus, a change in capacitance occurs. Accordingly, a location of the change in capacitance, as well as a degree of the change in capacitance, may be sensed to enable performance of a touch panel.

The touch sensitivity may be affected by, for example, a variation in capacitance when the touch screen layer 400 is touched, or by noise generated when the touch screen layer 400 is touched. In detail, the touch sensitivity may increase as the variation in the capacitance during touching increases, and as noise decreases. As the capacitance of the capacitor formed by the sensing pattern unit 410 and the opposite electrode 230 decreases, the change in the capacitance caused by touching may increase, and noise generation may decrease.

Because the capacitance of the capacitor formed by the sensing pattern unit 410 and the opposite electrode 230 decreases with an increase in a gap between the sensing pattern unit 410 and the opposite electrode 230, the cover layer 500 may be formed to have a thickness of about 5 μm or more, in consideration of the dielectric constant of silicon-based resin that is the cover layer 500. When the cover layer 500 has a thickness of less than about 5 μm, the capacitance of the capacitor formed by the sensing pattern unit 410 and the opposite electrode 230 may excessively increase, and thus, it may be more difficult to sense a change of the capacitance, and the noise that is generated during touching may also increase. Moreover, a charge/discharge speed of the capacitor may become lower than a driving frequency, thereby leading to a reduction in the touch sensitivity.

Thus, the cover layer 500 may be formed to have a thickness of about 5 μm to about 20 μm to improve the touch sensitivity of the touch screen layer 400, to protect the thin film encapsulation layer 300, and to maintain flexibility of the flexible display device 10.

The touch screen layer 400 may further include a touch pad unit 420 electrically connected to the sensing pattern unit 410. The touch pad unit 420 may be electrically connected to the pad unit 114, and may transmit to a driving circuit of the display unit 200 information corresponding to capacitance changes according to touch locations.

The touch pad unit 420 may be separated from the thin film encapsulation layer 300 in a horizontal direction (e.g., the touch pad unit 420 might not overlap the thin film encapsulation layer 300 in a vertical direction). Thus, the thin film encapsulation layer 300 may be prevented from being damaged by a vertical pressure applied during a compression process for connecting the connection unit 450 to the touch pad unit 420.

For example, the touch pad unit 420 may be aligned with the pad unit 114 outside of/at an exterior of the thin film encapsulation layer 200, and thus a dead area (e.g., a non-display area) of the flexible display device 10 may be reduced, and the flexible display device 10 may have a compact structure.

A connection unit 450 is positioned under the touch pad unit 420, and is electrically connected to the touch pad unit 420. Because the cover layer 500 is positioned under the sensing pattern unit 410, and because the connection unit 450 is positioned under the touch pad unit 420, the connection unit 450 may be adjacent a lateral surface of the cover layer 500 (e.g., a surface of the cover layer 500 extending in a plane direction defined by the Z-axis and the Y-axis in FIG. 2). For example, the connection unit 450 and the cover layer 500 may contact each other at lateral surfaces thereof.

The connection unit 450 may include an insulative resin layer with conductive balls distributed therein. For example, the connection unit 450 may be an anisotropical conductivity adhesive (ACA). When the connection unit 450 is compressed to be attached to the touch pad unit 420, the conductive balls may be exposed to the outside (e.g., exposed to surfaces of the insulative resin layer), and the connection unit 450 may be electrically connected to the touch pad unit 420 by the exposed conductive balls.

The insulative resin layer may be formed of highly-adhesive and highly-insulative thermosetting resin, for example, epoxy resin, acryl resin, polyimide resin, or polycarbonate resin, and the conductive balls may be, for example, Au, Ag, Ni, or Cu balls, which are highly conductive, or may be balls obtained by plating a polymer material with each of the above-described metals.

The second flexible substrate 102 has flexible characteristics, and may be formed of polyimide, acrylate, and/or the like. However, embodiments of the present invention are not limited thereto, and the second flexible substrate 102 may be formed of various other materials, such as a plastic material, such as PET, PEN, and/or a metal material. In some cases, the second flexible substrate 102 may be formed of a thin metal foil, such as SUS.

The second flexible substrate 102 is partially cut away, and thus may expose the pad unit 114. Because the touch pad unit 420 may be aligned with the pad unit 114 outside the thin film encapsulation layer 200, and because the second flexible substrate 102 covers the touch screen layer 400, the second flexible substrate 102 may be shaped such that a portion of one lateral side of the second flexible substrate 102 extends beyond the thin film encapsulation layer 200 and covers the touch pad unit 420.

Because the first flexible substrate 101 and the second flexible substrate 102 may be formed to have not only flexibility, but to also have a sufficient hardness (e.g., by using a filler, an additive, and/or the like), the first flexible substrate 101 and the second flexible substrate 102 may function as a protection layer(s).

Figure 4:
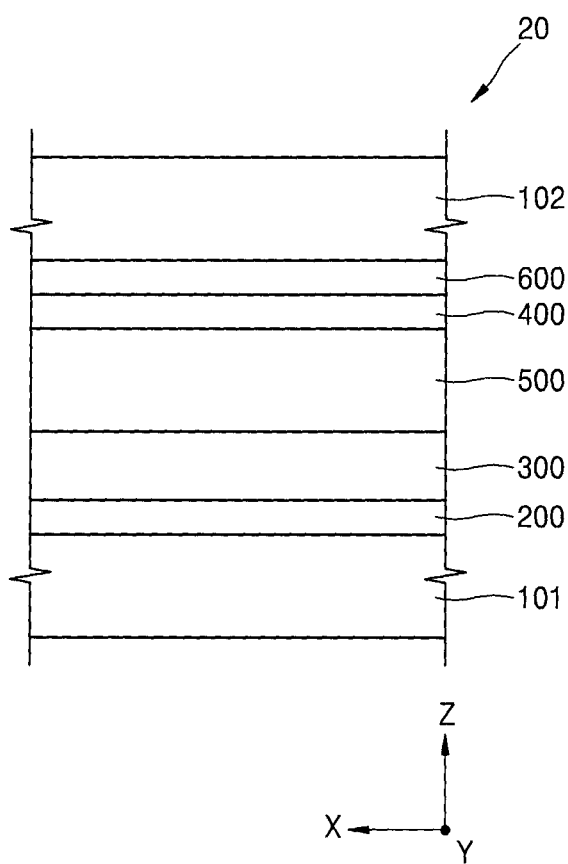
FIG. 4 is a cross-sectional view of a modification of the flexible display device of FIG. 1.
Figure 5:
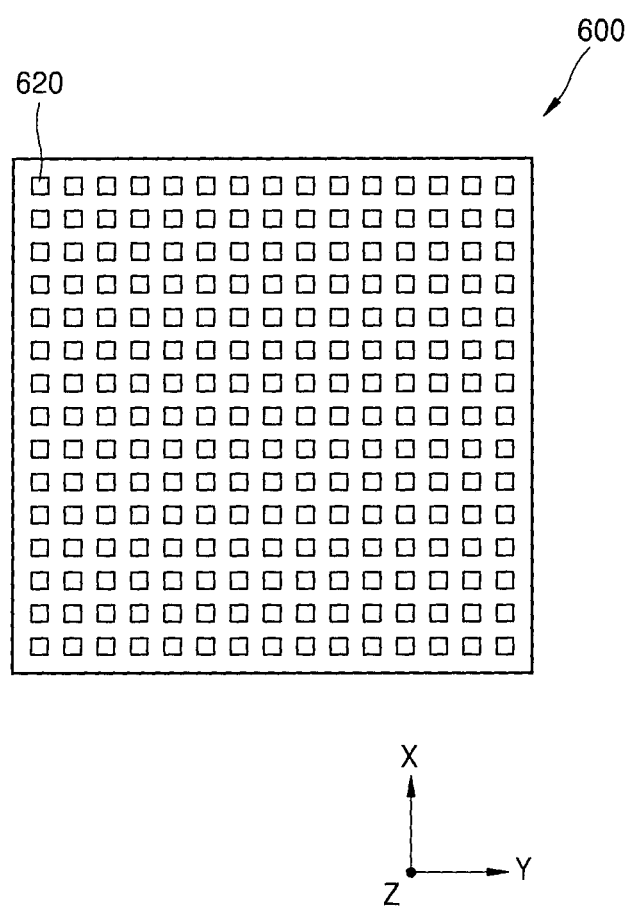
FIG. 5 is a schematic cross-sectional view of a polarization layer of a flexible display device of FIG. 4.

FIG. 4 is a cross-sectional view of a modification of the flexible display device 10 of FIG. 1. FIG. 5 is a schematic plan view of a polarization layer 600 of a flexible display device 20 of FIG. 4. FIG. 4 illustrates a cross-section of the flexible display device 20 taken along the line II-II' of FIG. 1.

Referring to FIG. 4, the flexible display device 20 may include a first flexible substrate 101, a display unit 200 on the first flexible substrate 101, a thin film encapsulation layer 300 encapsulating the display unit 200, a cover layer 500 on the thin film encapsulation layer 300, a touch screen layer 400 on the cover layer 500, a polarization layer 600 on the touch screen layer 400, and a second flexible substrate 102 on the polarization layer 600. In other words, the flexible display device 20 of FIG. 4 further includes the polarization layer 600, when compared to the flexible display device 10 of FIGS. 1-3.

Because the first flexible substrate 101, the display unit 200, the thin film encapsulation layer 300, the cover layer 500, the touch screen layer 400 and the second flexible substrate 102 may be the same as the respective components described above with reference to FIGS. 1-3, a repeated description thereof will be omitted here.

The polarization layer 600 may include a plurality of apertures 620 (see FIG. 5). The plurality of apertures 620 may be formed at locations respectively corresponding to a plurality of sub-pixels of the display unit 200. Filters corresponding to the colors of light emitted by the sub pixels may be respectively located within the plurality of apertures 620. Thus, an image displayed by the display unit 200 may have improved color purity.

The polarization layer 600 may be formed of a black material such as molybdenum (Mo), and may be located between the touch screen layer 400 and the second flexible substrate 102. Thus, the polarization layer 600 may function as a black matrix over an area other than the sub pixels of the display unit 200 (e.g., over an area between, or surrounding, the sub pixels), and may prevent reflection of external light by the touch screen layer 400, thereby improving the contrast of the flexible display device 20.

FIGS. 6-11 are schematic views for explaining a method of manufacturing the flexible display device 10 of FIG. 1, according to an embodiment of the present invention.

Figure 10:
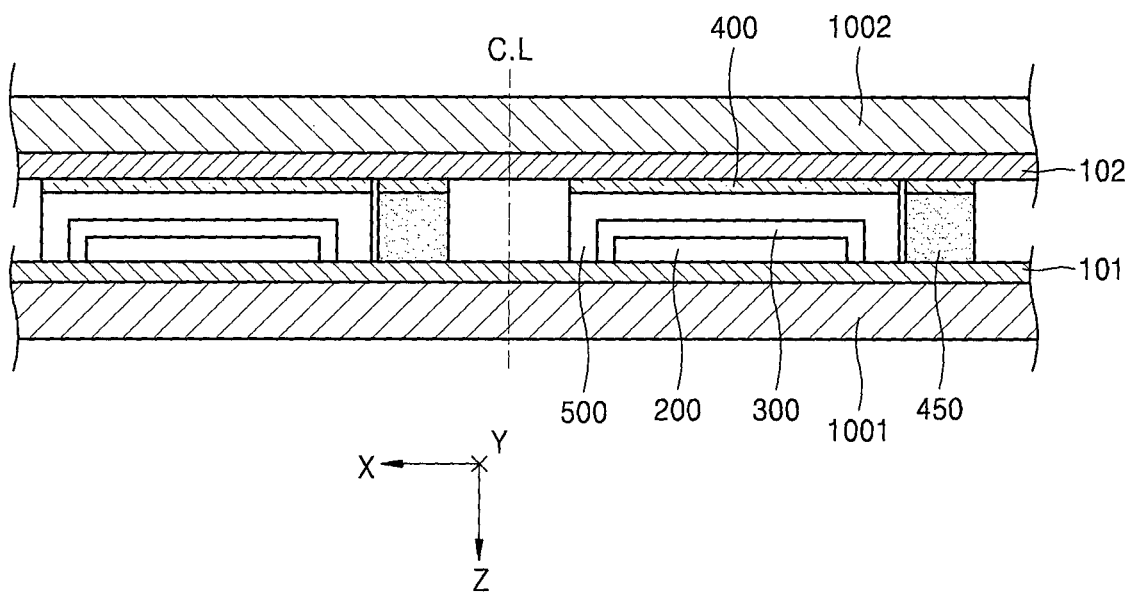
Figure 10:
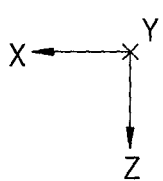

The method of manufacturing the flexible display device 10 of FIG. 1 may include preparing for a first mother substrate 1001 (see FIG. 6) having a first surface on which a plurality of display units 200 and a plurality of thin film encapsulation layer 300 are formed, and a second mother substrate 1002 (see FIG. 8) having a plurality of touch screen layers 400 formed on a surface for facing the first surface of the first mother substrate 1001, adhering the first mother substrate 1001 and the second mother substrate 1002 together, and cutting the first mother substrate 1001 and the second mother substrate 1002 along cutting lines C.L (see FIG. 10).

Figure 8:
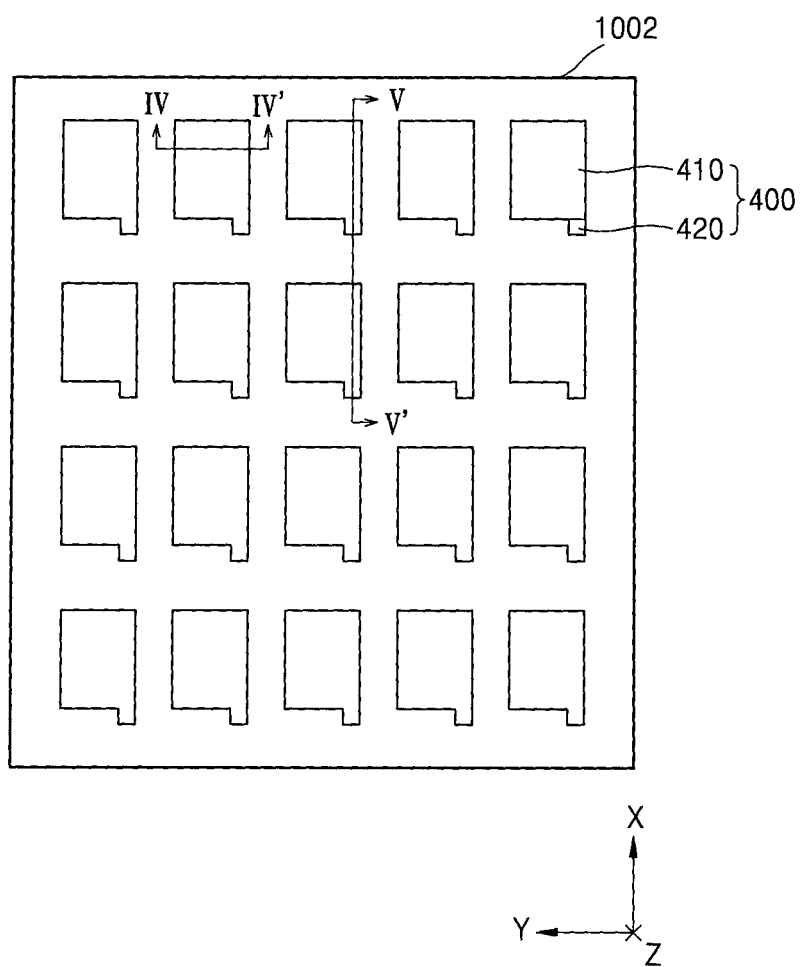
Figure 9:
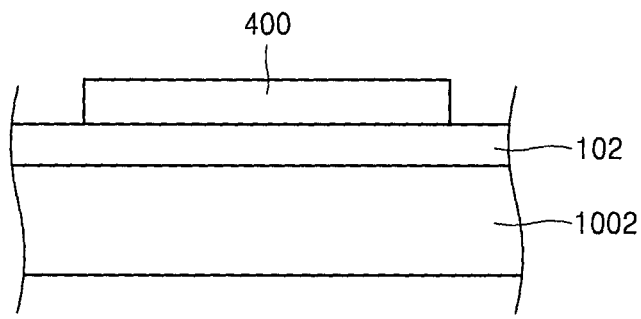
Figure 9:
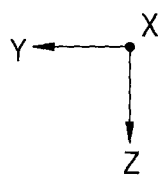

The method of manufacturing the flexible display device 10 of FIG. 1 will now be described in more detail with reference to FIGS. 6-11. FIG. 7 is a schematic cross-sectional view taken along the line III-III' of FIG. 6, FIG. 9 is a schematic cross-sectional view taken along the line IV-IV' of FIG. 8, and FIG. 10 is a schematic cross-sectional view taken along the line V-V of FIG. 8.

Figure 6:
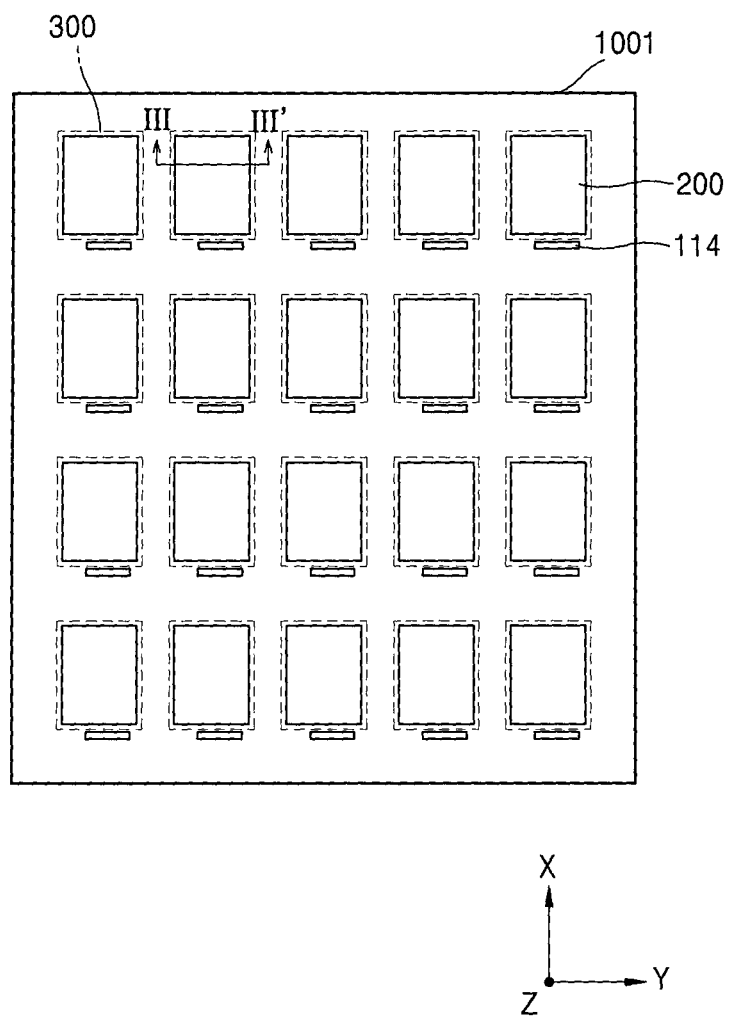
FIGS. 6-11 are schematic views for explaining a method of manufacturing the flexible display device of FIG. 1, according to an embodiment of the present invention.
Figure 7:
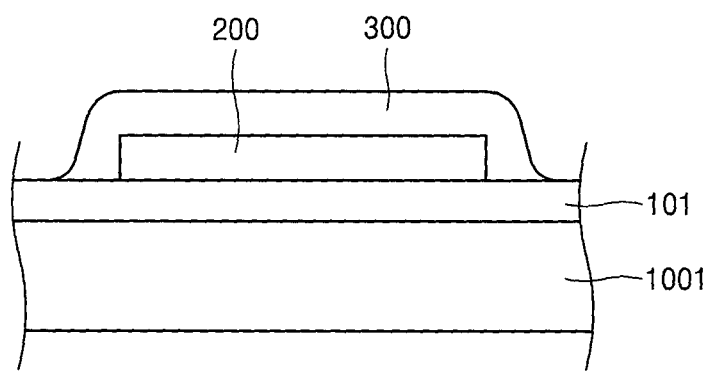
Figure 7:
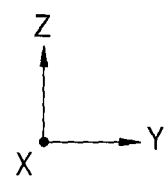

First, as shown in FIGS. 6 and 7, after the first flexible substrate 101 is formed on an entire surface of the first mother substrate 1001, the plurality of display units 200 are formed on the first flexible substrate 101, and the plurality of thin film encapsulation layers 300 for respectively encapsulating the plurality of display units 200 are formed on the first flexible substrate 101.

The first mother substrate 1001 is formed of a rigid material, such as glass, and functions as a support when the first flexible substrate 101 and the plurality of display units 200 are formed.

The plurality of display units 200 may form a plane lattice pattern. When the plurality of display units 200 are formed, pad units 114 may also be formed on the first flexible substrate 101, and may be respectively electrically connected to the plurality of display units 200.

Because the display units 200 were described above with reference to FIG. 3, and because various shapes and sizes may be applied to each of the display units 200, a detailed description of a method of manufacturing the display units 200 is omitted.

Each of the thin film encapsulation layers 300 may be formed by alternately stacking a plurality of organic layers and a plurality of inorganic layers on one another. For example, the plurality of organic layers may be formed by vaporizing and depositing liquid monomer, radiating ultraviolet rays to the deposited monomer, and changing the monomer to a polymer. Further, for example, the plurality of inorganic layers may be formed via sputtering, atomic layer deposition, chemical vapor deposition, or the like.

Next, as shown in FIGS. 8 and 9, the second flexible substrate 102 is formed on an entire surface of the second mother substrate 1002, and then the plurality of touch screen layers 400 are formed on the second flexible substrate 102. For convenience of explanation, FIG. 8 illustrates a surface of the second mother substrate 1002 on which the plurality of touch screen layers 400 are formed, as viewed from the top.

The second mother substrate 1002 is formed of a rigid material, such as glass, and functions as a support when the second flexible substrate 102 and the plurality of touch screen layers 400 are formed.

Each of the plurality of touch screen layers 400 may include a sensing pattern unit 410 and a touch pad unit 420. The plurality of touch screen layers 400 may be formed by depositing a transparent material, such as indium tin oxide (ITO), indium zinc oxide (IZO), indium oxide (IO), Ga-doped oxide (GZO), zinc oxide (ZnO), Al-doped oxide (AZO), fluorine doped tin oxide (FTO), antimony doped tin oxide (ATO), and/or $In_2O_3$, on the second flexible substrate 102 and then patterning the deposited transparent material via photo lithography.

Then, as shown in FIG. 10, after each of the plurality of touch screen layers 400 is coated with a filler, the first mother substrate 1001 and the second mother substrate 1002 are arranged/aligned such that the plurality of display units 200 face the plurality of touch screen layers 400, and then the filler is hardened to thereby form cover layers 500. The filler is coated on only the sensing pattern unit 410 of each of the plurality of touch screen layers 400. Thus, the cover layers 500 are located under the sensing pattern units 410.

Each of the cover layers 500 may be formed of an elastic and adhesive material. For example, each of the cover layers 500 may be formed of silicon-based resin including a siloxane cross-link reaction, for example, polymethyltrifluoropropyl siloxane and/or polymethylvinyl-siloxane. Thus, the first mother substrate 1001 and the second mother substrate 1002 may be adhered together by the cover layers 500, and, even when particles exist on the thin film encapsulation layer 300 while the first mother substrate 1001 and the second mother substrate 1002 are being adhered together, the cover layers 500 may prevent the thin film encapsulation layer 300 from being damaged by the particles. Each of the cover layers 500 may be formed to have a thickness of about 1 μm to about 20 μm.

When the filler is coated, an insulative resin layer in which conductive balls are distributed may also be coated on or attached to the touch pad units 420. The insulative resin layer in which conductive balls are distributed may be hardened when the filler is hardened, thereby forming connection units 450. The insulative resin layer in which the conductive balls are distributed may be an ACA. When the connection units 450 are compressed to be attached to the touch pad units 420, the conductive balls are exposed to contact the touch pad units 420.

Figure 11:
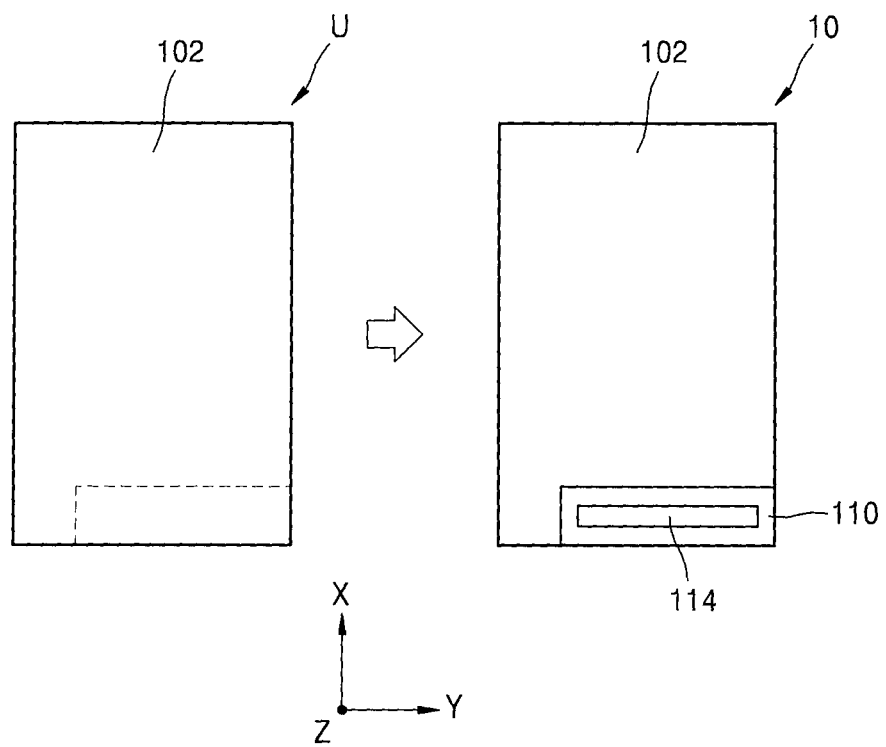

Then, the adhered first and second mother substrates 1001 and 1002 are cut along the cutting lines C.L. Thus, as shown in FIG. 11, a plurality of display units U are formed, and the cut portions of the first mother substrate 1001 and the cut portions of the second mother substrate 1002 are removed from the plurality of display units U.

For example, by radiating a laser to the first flexible substrate 101 and the second flexible substrate 102, the first mother substrate 1001 and the second mother substrate 1002 may be respectively separated from the first flexible substrate 101 and the second flexible substrate 102. However, embodiments of the present invention are not limited thereto. In other words, before the first flexible substrate 101 and the second flexible substrate 102 are formed on the first mother substrate 1001 and the second mother substrate 1002, a graphene oxide layer may be further formed, and the first mother substrate 1001 and the second mother substrate 1002 may be physically separated from the first flexible substrate 101 and the second flexible substrate 102.

After the first mother substrate 1001 and the second mother substrate 1002 are removed, each of the plurality of display units U includes a first flexible substrate 101 and a second flexible substrate 102. The first flexible substrates 101 may be the same size and the second flexible substrates 102 may be the same size. The second flexible substrates 102 may be partially cut further to expose the pad units 114.

As described above, in the method of manufacturing the flexible display device 10, according to an embodiment of the present invention, after the plurality of touch screen layers 400 are first formed on the second mother substrate 1002, the first mother substrate 1001 and the second mother substrate 1002 undergo an adhering process and a cutting process, thereby manufacturing flexible display devices 10. Thus, the manufacturing yield may be higher than that of the case in which touch screen panels are individually attached to flexible display devices 10. Because the touch screen layers 400 are formed on the second flexible substrates 102 via deposition, adhesion layers for attaching the touch screen layers 400 to the second flexible substrates 102 are not required. Thus, the flexible display devices 10 may each have a smaller thickness, and the cover layers 500 formed of silicon-based resin may each have a thickness of about 5 μm to about 20 μm, thereby improving the touch sensitivity of the touch screen layers 400.

Although FIGS. 6-11 explain the method of manufacturing the flexible display device 10 of FIG. 1, this method may be equally applied to a method of manufacturing the flexible display device 20 of FIG. 4. However, the method of manufacturing the flexible display device 20 of FIG. 4 may further include forming a plurality of polarization layers 600 of FIG. 4 on the second flexible substrates 102.

Each of the plurality of polarization layers 600 of FIG. 4 may include a plurality of apertures, and a red filter, a green filter, and/or a blue filter may be formed in respective ones of the apertures. The plurality of apertures may overlap the sub-pixels of the display units 200, and the filters may have the same colors as the colors of light emitted by corresponding ones of the sub-pixels.

After Mo or the like is deposited on the second flexible substrates 102, the plurality of polarization layers 600 of FIG. 4 may be process to form the plurality of apertures via photo lithography. The plurality of touch screen layers 400 may be formed by depositing a transparent material, such as indium tin oxide (ITO), indium zinc oxide (IZO), indium oxide (IO), Ga-doped oxide (GZO), zinc oxide (ZnO), Al-doped oxide (AZO), fluorine doped tin oxide (FTO), antimony doped tin oxide (ATO), and/or $In_2O_3$, on the second flexible substrates 102 on which the plurality of polarization layers 600 of FIG. 4 have been formed, and by then patterning the deposited transparent material via photo lithography. In other words, the polarization layers 600 of FIG. 4 and the touch screen layers 400 are formed on the second flexible substrates 102 via deposition, and adhesion layers for attaching the polarization layers 600 and the touch screen layers 400 to the second flexible substrates 102 may be omitted.

According to embodiments of the present invention, a flexible display device may have improved touch sensitivity, and a manufacturing yield of the flexible display device may improve.

It should be understood that the exemplary embodiments described therein should be considered in a descriptive sense only and not for purposes of limitation. Descriptions of features or aspects within each embodiment should typically be considered as available for other similar features or aspects in other embodiments.

While the present invention has been particularly shown and described with reference to exemplary embodiments thereof, it will be understood by those of ordinary skill in the art that various changes in form and details may be made therein without departing from the spirit and scope of the present invention as defined by the following claims and their equivalents.

What is claimed is:

1. A flexible display device comprising:

a first flexible substrate;

a display unit on the first flexible substrate;

a thin film encapsulation layer covering the display unit entirely for encapsulating the display unit;

a cover layer for covering the thin film encapsulation layer, the cover layer contacting the first flexible substrate;

a touch screen layer on the cover layer;

a second flexible substrate on the touch screen layer; and a polarization layer between the touch screen layer and the second flexible substrate, wherein the touch screen layer comprises a sensing pattern unit, and a touch pad unit electrically connected to the sensing pattern unit, wherein the cover layer is under the sensing pattern unit, wherein a thickness of the cover layer from an upper surface of the thin film encapsulation layer to a lower surface of the touch screen layer is about 1 μm to about 20 μm, wherein the thin film encapsulation layer and the touch screen layer are adhered by the cover layer, and wherein the touch screen layer is formed on the polarization layer and the touch screen layer and the polarization layer are formed on the second flexible substrate via deposition, and the polarization layer and the touch screen layer directly contact each other.

2. The flexible display device of claim 1, wherein the thickness of the cover layer is about 5 μm to about 20 μm.

3. The flexible display device of claim 1, wherein the cover layer comprises silicon-based resin.

4. The flexible display device of claim 1, further comprising a connection unit under the touch pad unit and at a lateral side of the cover layer.

5. The flexible display device of claim 4, further comprising:
a pad unit on the first flexible substrate and configured to transmit an electrical signal to the display unit,
wherein the touch pad unit and the pad unit are aligned with each other at an exterior of the thin film encapsulation layer.

6. The flexible display device of claim 5, wherein the second flexible substrate is cut to expose the pad unit on the first flexible substrate.

7. The flexible display device of claim 4, wherein the connection unit comprises an insulative resin layer with conductive balls distributed therein.

8. The flexible display device of claim 1, wherein the display unit comprises a plurality of sub-pixels, and
wherein the polarization layer defines a plurality of apertures at locations corresponding to respective ones of the sub-pixels.

9. The flexible display device of claim 8, further comprising color filters corresponding to colors of light emitted by the plurality of sub-pixels within respective ones of the apertures.

10. A flexible display device comprising:
a first flexible substrate;
a display unit on the first flexible substrate;
a thin film encapsulation layer for encapsulating the display unit;
a cover layer for covering the thin film encapsulation layer;
a touch screen layer on the cover layer;
a second flexible substrate on the touch screen layer; and
a polarization layer between the touch screen layer and the second flexible substrate,
wherein the touch screen layer comprises a sensing pattern unit, and a touch pad unit electrically connected to the sensing pattern unit,
wherein the cover layer is under the sensing pattern unit,
wherein a thickness of the cover layer from an upper surface of the thin film encapsulation layer to a lower surface of the touch screen layer is about 1 μm to about 20 μm,
wherein the thin film encapsulation layer covers the display unit as a whole, and comprises an inorganic layer and an organic layer, the inorganic and organic layers of the thin film encapsulation layer being stacked on each other, and
wherein the touch screen layer is formed on the polarization layer and the touch screen layer and the polarization layer are formed on the second flexible substrate via deposition, and the polarization layer and the touch screen layer directly contact each other.

* * * * *